(12) United States Patent
Otsubo

(10) Patent No.: US 10,999,956 B2
(45) Date of Patent: May 4, 2021

(54) MODULE

(71) Applicant: Murata Manufacturing Co., Ltd., Kyoto (JP)

(72) Inventor: Yoshihito Otsubo, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 16/562,680

(22) Filed: Sep. 6, 2019

(65) Prior Publication Data

US 2020/0008325 A1   Jan. 2, 2020

Related U.S. Application Data

(63) Continuation of application No. PCT/JP2018/008681, filed on Mar. 7, 2018.

(30) Foreign Application Priority Data

Mar. 8, 2017   (JP) .............................. JP2017-044068

(51) Int. Cl.
  *H05K 9/00*   (2006.01)
  *H05K 1/02*   (2006.01)
  (Continued)

(52) U.S. Cl.
  CPC ......... *H05K 9/0022* (2013.01); *H05K 1/0216* (2013.01); *H05K 1/113* (2013.01);
  (Continued)

(58) Field of Classification Search
  CPC ...... H05K 9/0022; H05K 5/065; H05K 1/181; H05K 1/113; H05K 1/0216;
  (Continued)

(56) References Cited

U.S. PATENT DOCUMENTS

| 7,198,987 B1 * | 4/2007 | Warren | ................. | H01L 23/552 |
| | | | | 257/E23.114 |
| 8,012,868 B1 * | 9/2011 | Naval | ................... | H01L 23/552 |
| | | | | 438/617 |

(Continued)

FOREIGN PATENT DOCUMENTS

| JP | H06-169288 A | 6/1994 |
| JP | 2002-258067 A | 9/2002 |

(Continued)

OTHER PUBLICATIONS

International Search Report for PCT/JP2018/008681 dated May 22, 2018.
Written Opinion for PCT/JP2018/008681 dated May 22, 2018.

*Primary Examiner* — Hung S. Bui
*Assistant Examiner* — Sagar Shrestha
(74) *Attorney, Agent, or Firm* — Pearne & Gordon LLP

(57) ABSTRACT

A module includes a wiring substrate; a component; a metal pin attached to a land electrode formed at one main surface and has a first extending portion extends from the one main surface, a second extending portion that is bent and extends from one end of the first extending portion on an opposite side from the one end surface, and a third extending portion that is bent and extends from one end of the second extending portion on an opposite side from the first extending portion to approach the one main surface; a sealing resin layer that covers the one main surface, the component, and the metal pin; and a shield layer that covers a side surface of the wiring substrate, a surface of the sealing resin layer, and the upper surface and the side outer surface of the metal pin.

14 Claims, 8 Drawing Sheets

(51) Int. Cl.
*H05K 1/11* (2006.01)
*H05K 1/18* (2006.01)
*H05K 5/06* (2006.01)

(52) U.S. Cl.
CPC ............ *H05K 1/181* (2013.01); *H05K 5/065* (2013.01); *H05K 2201/10318* (2013.01); *H05K 2201/10522* (2013.01)

(58) Field of Classification Search
CPC .......... H05K 2201/10522; H05K 2201/10318; H05K 9/0064; H05K 2201/10371; H05K 2203/1327; H05K 2203/1316; H05K 3/284; H05K 2201/0715; H05K 1/0224; H05K 9/0081; H05K 9/0024; H01L 23/28; H01L 23/00; H01L 23/552; H01L 21/561; H01L 2224/97
See application file for complete search history.

(56) References Cited

U.S. PATENT DOCUMENTS

| | | | | |
|---|---|---|---|---|
| 9,793,222 | B1* | 10/2017 | Lee | H01L 25/0655 |
| 10,297,998 | B2* | 5/2019 | Tsuchida | H01F 27/36 |
| 2004/0012099 | A1 | 1/2004 | Nakayama | |
| 2005/0067676 | A1* | 3/2005 | Mahadevan | H01L 23/3107 257/659 |
| 2008/0014678 | A1* | 1/2008 | Howard | H01L 24/85 438/106 |
| 2008/0272469 | A1* | 11/2008 | Kwak | H01L 21/561 257/659 |
| 2009/0152688 | A1* | 6/2009 | Do | H01L 23/552 257/659 |
| 2009/0236700 | A1 | 9/2009 | Moriya | |
| 2010/0014240 | A1* | 1/2010 | Renwick | G06F 1/1616 361/679.27 |
| 2011/0084378 | A1* | 4/2011 | Welch | H01L 21/56 257/692 |
| 2012/0025356 | A1* | 2/2012 | Liao | H01L 23/3121 257/659 |
| 2012/0139089 | A1* | 6/2012 | Huang | H01L 23/552 257/659 |
| 2015/0264797 | A1* | 9/2015 | Happoya | H01L 23/552 361/783 |
| 2016/0181206 | A1* | 6/2016 | Read | H01L 23/552 343/873 |
| 2017/0118875 | A1* | 4/2017 | Kumbhat | H01L 23/552 |
| 2017/0118877 | A1* | 4/2017 | Kumbhat | H05K 3/0014 |
| 2018/0098418 | A1* | 4/2018 | Lee | H05K 1/0216 |
| 2019/0393166 | A1* | 12/2019 | Otsubo | H01L 25/18 |

FOREIGN PATENT DOCUMENTS

| | | |
|---|---|---|
| JP | 2003-249607 A | 9/2003 |
| JP | 2004-172176 A | 6/2004 |
| JP | 2005-303110 A | 10/2005 |
| JP | 2011-529638 A | 12/2011 |
| JP | 5276169 B2 | 8/2013 |
| JP | 2015-176973 A | 10/2015 |
| WO | 2008/093414 A1 | 8/2008 |
| WO | 2010/014103 A1 | 2/2010 |

* cited by examiner

MODULE

This is a continuation of International Application No. PCT/JP2018/008681 filed on Mar. 7, 2018 which claims priority from Japanese Patent Application No. 2017-044068 filed on Mar. 8, 2017. The contents of these applications are incorporated herein by reference in their entireties.

BACKGROUND

Technical Field

The present disclosure relates to a module that has a shield layer.

In a module in which a component mounted on a wiring substrate is covered by sealing resin, the surface of the sealing resin layer and so forth may be covered by a shield layer so that the characteristics of the module are not impaired by the effect of electromagnetic waves and the like from the outside. A circuit module 100 disclosed in Patent Document 1 and illustrated in FIG. 10 is an example of such a module having a shield layer.

The circuit module 100 includes: a circuit substrate 101; a plurality of components 102; a sealing resin layer 103 formed on an upper surface of the circuit substrate 101 so as to cover the components 102; and a shield layer 104 that is formed on the surface of the sealing resin layer 103 and shields against the effect of electromagnetic waves and so forth from the outside. Furthermore, a ground electrode 105, an inner layer pattern 106, and holes 107 are provided inside the circuit substrate 101 and a ground electrode 108 is provided on a rear surface of the circuit substrate 101. The ground electrode 105 provided inside the circuit substrate 101 is exposed from the side surfaces of the circuit substrate 101 and contacts the shield layer 104.

Patent Document 1: Japanese Unexamined Patent Application Publication No. 2004-172176 (refer to paragraphs 0021-0023 and FIGS. 2A and 2B).

BRIEF SUMMARY

However, in the above-described circuit module 100, since the areas of the exposed surfaces where the ground electrode 105 is exposed from the side surfaces of the circuit substrate 101 are small, the areas of the surfaces where the shield layer 104 and the ground electrode 105 contact each other are small. Therefore, there is a risk that the electrical connection between the shield layer 104 and the ground electrode 105 will be unsatisfactory and that a shielding effect realized by the shield layer 104 will not be satisfactorily obtained.

The present disclosure provides a module that can improve the electrical connectivity between a shield layer and an electrode formed on a wiring substrate.

A module according to the present disclosure includes: a wiring substrate; a component that is mounted on one main surface of the wiring substrate; a metal pin that has one end surface that is attached to an electrode formed at the one main surface and that includes a first extending portion that extends from the electrode formed at the one end surface away from the one main surface, a second extending portion that is bent and extends from one end of the first extending portion on an opposite side from the one end surface, and a third extending portion that is bent and extends from one end of the second extending portion on an opposite side from the first extending portion so as to approach the one main surface; a sealing resin layer that covers the one main surface and the component and covers the metal pin except for at least a part of the extending portions; and a shield layer that covers a side surface of the wiring substrate and a surface of the sealing resin layer. The shield layer contacts the at least the part of the extending portions that is not covered by the sealing resin layer.

According to the above-described configuration, the shield layer covers and contacts part of the metal pin and therefore the area of contact between the shield layer and the metal pin is larger than in a case where the shield layer contacts an exposed portion of a ground electrode provided inside a circuit substrate. Thus, the electrical connectivity between the shield layer and the electrode formed at the one main surface of the wiring substrate can be improved. In addition, the shielding effect realized by the shield layer can be improved by electrically connecting the electrode to which the metal pin is attached to a ground electrode.

In addition, the second extending portion of the metal pin may contact the shield layer. According to this configuration, the area of contact between the shield layer and the metal pin is increased and therefore the electrical connectivity between the shield layer and the electrode formed at the one main surface of the wiring substrate can be improved.

In addition, the third extending portion of the metal pin may contact a side surface of the shield layer. According to this configuration, the area of contact between the shield layer and the metal pin is increased and therefore the electrical connectivity between the shield layer and the electrode formed at the one main surface of the wiring substrate can be improved.

Furthermore, the third extending portion may extend up to a position at which the third extending portion contacts the wiring substrate. According to this configuration, the metal pin can be more stably fixed to the wiring substrate.

Furthermore, the third extending portion may not extend up to a position at which the third extending portion would contact the wiring substrate. According to this configuration, the metal pin is buried inside the sealing resin layer except that the one end surface thereof is exposed from the sealing resin layer, and therefore a gap is not generated between the metal pin and the one main surface of the wiring substrate due to the metal pin being exposed from the sealing resin layer and the performance reliability of the module is improved.

In addition, the first extending portion may be connected to a ground electrode provided in or on the wiring substrate via the electrode. According to this configuration, it is not necessary to make a ground electrode provided in a wiring substrate extend up to an edge portion of the wiring substrate in order to connect the ground electrode to a shield layer and therefore the degree of freedom with respect to a design area of the wiring substrate is improved.

According to the present disclosure, the shield layer covers and contacts part of the metal pin and therefore the area of contact between the shield layer and the metal pin is larger than in a case where the shield layer contacts an exposed portion of a ground electrode provided inside the circuit substrate. Thus, the electrical connectivity between the shield layer and the electrode formed at the one main surface of the wiring substrate can be improved. In addition, the shielding effect realized by the shield layer can be improved by electrically connecting the electrode to which the metal pin is attached to a ground electrode.

DESCRIPTION OF EMBODIMENTS

First Embodiment

Figure 1:
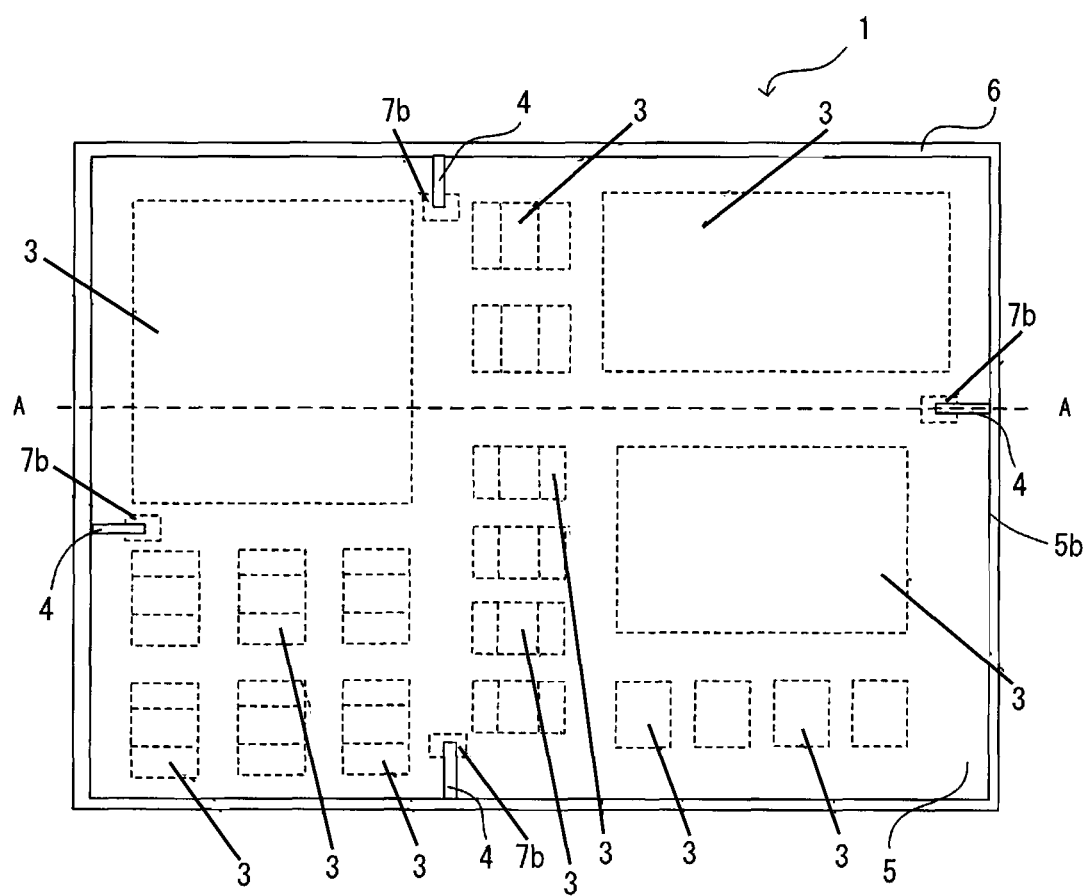
FIG. 1 is a plan view of a module according to a first embodiment of the present disclosure in a state where an upper surface part of a shield layer of the module has been removed.
Figure 2A:
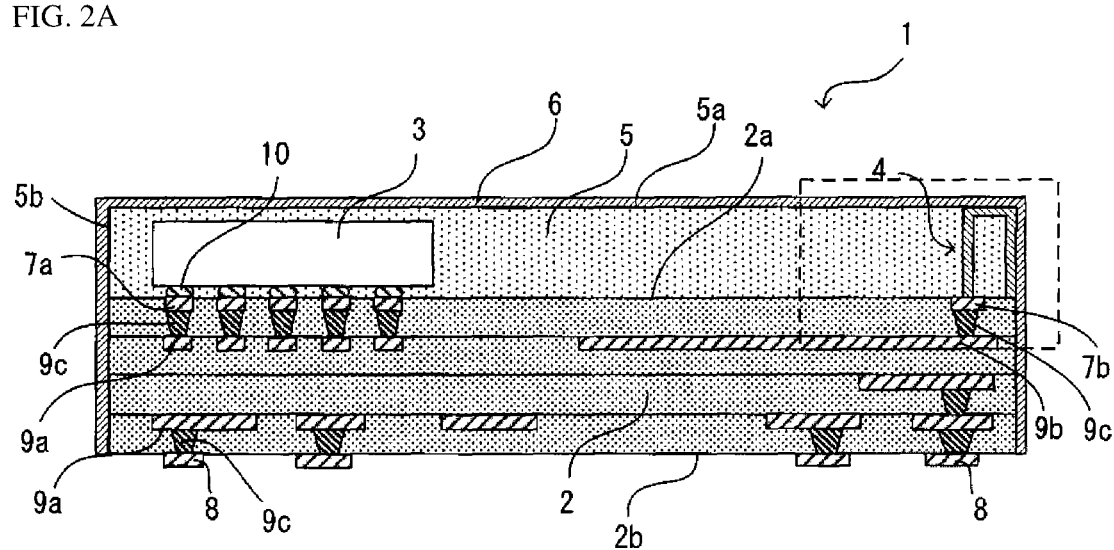
FIG. 2A is a sectional view taken along A-A in FIG. 1 so as to include the upper surface part of the shield layer and FIG. 2B is an enlarged view of a part enclosed by a broken line in FIG. 2A.
Figure 2B:
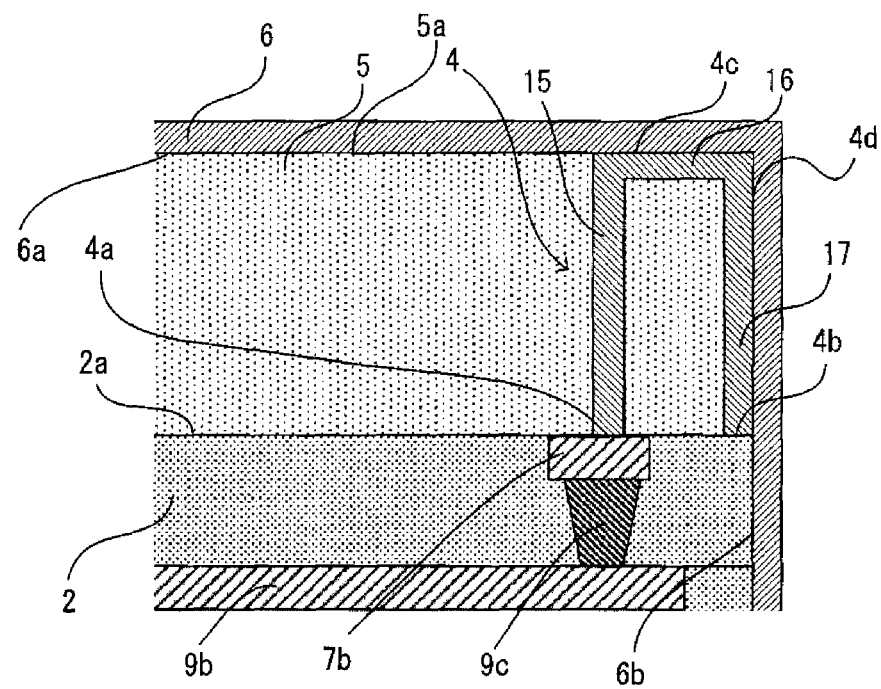

A module 1 according to a first embodiment of the present disclosure will be described while referring to FIGS. 1 and 2. FIG. 1 is a plan view of the module 1 according to the first embodiment in a state where an upper surface part of a shield layer 6 of the module 1 has been removed. FIG. 2A is a sectional view taken along A-A in FIG. 1 so as to include the upper surface part of the shield layer 6 and FIG. 2B is an enlarged view of a part enclosed by a broken line in FIG. 2A.

The module 1 according to the first embodiment is a module that is to be mounted on a mother substrate or the like of an electronic device, for example. The module 1 includes: a wiring substrate 2 that has land electrodes 7a and 7b formed at one main surface 2a thereof; components 3 that are mounted on the one main surface 2a such that connection terminals thereof are connected to the land electrodes 7a using solder 10; metal pins 4 each having one end surface 4a that is electrically connected to a corresponding land electrode 7b and a pin upper surface 4c and a pin side outer surface 4d, which will be described later, that contact and are electrically connected to the shield layer 6; a sealing resin layer 5 that covers the one main surface 2a and the components 3 and covers the plurality of metal pins 4 except for the pin upper surfaces 4c and the pin side outer surfaces 4d of the metal pins 4; and a shield layer 6 that contacts and covers the surface of the sealing resin layer 5, the side surface of the wiring substrate 2 and the pin upper surfaces 4c and the pin side outer surfaces 4d of the metal pins 4. The pin upper surface 4c and the pin side outer surface 4d each corresponds to "at least a part of the extending portions of the metal pin" of the present disclosure. In this embodiment, the shield layer 6 contacts the entire upper surface 4c and the entire side surface 4d.

The wiring substrate 2 is formed of a low-temperature co-fired ceramic, a glass epoxy resin, or the like. A plurality of land electrodes 7a and 7b are formed at the one main surface 2a of the wiring substrate 2, a plurality of outer electrodes 8 are formed on another main surface 2b of the wiring substrate 2, and a plurality of wiring electrodes 9a, ground electrodes 9b, a plurality of via conductors 9c, and so forth are formed in inner layers of the wiring substrate 2. The land electrodes 7a are connected to the wiring electrodes 9a via the via conductors 9c, the land electrodes 7b are connected to the ground electrodes 9b via the via conductors 9c, and the outer electrodes 8 are connected to the wiring electrodes 9a and the ground electrodes 9b via the via conductors 9c. The wiring substrate 2 corresponds to a "wiring substrate" of the present disclosure and the land electrodes 7b correspond to an "electrode" of the present disclosure.

The land electrodes 7a and 7b, the outer electrodes 8, the wiring electrodes 9a, and the ground electrodes 9b are formed of a metal that is typically used for electrodes such as Cu, Ag, Al or the like. In addition, the via conductors 9c are formed of a metal such as Ag or Cu.

The components 3 are mounted on the one main surface 2a of the wiring substrate 2 by connecting the connection terminals thereof to the land electrodes 7a formed at the one main surface 2a of the wiring substrate 2 using solder 10, for example.

The plurality of metal pins 4 are provided in the vicinity of the edges of the wiring substrate 2, are formed of a metal such as copper using a die for example, or are formed by bending rod-shaped, wire-shaped, or plate-shaped pieces of a metal such as copper. The metal pins 4 have an inverted U shape, and the one end surfaces 4a thereof are attached to the land electrodes 7b using for example solder so as to form an electrically connection, and other end surfaces 4b thereof contact the one main surface 2a. The metal pins 4 each have a rectangular-parallelepiped-shaped first extending portion 15 that extends from the one end surface 4a away from the one main surface 2a. In addition, each metal pin 4 has a rectangular-parallelepiped-shaped second extending portion 16 that is bent at a prescribed angle such as a right angle and extends from one end of the first extending portion 15 on the opposite side from the one end surface 4a. Furthermore, each metal pin 4 has a rectangular-parallelepiped-shaped third extending portion 17 that has the same length as the first extending portion 15 and is bent and extends from one end of the second extending portion 16 on the opposite side from the first extending portion 15 so as to approach the one main surface 2a up to a position at which the third extending portion 17 contacts the one main surface 2a.

The sealing resin layer 5 seals the one main surface 2a, the components 3, and the metal pins 4 so as to cover the one main surface 2a and the components 3 and the metal pins 4 except for part of the surface of each metal pin 4. The part of the surface of each metal pin 4 that is not covered by the sealing resin layer 5 consists of the surface (hereafter, referred to as "pin upper surface") 4c of the second extending portion 16, which is on the opposite side from the surface that faces the one main surface 2a, and a surface (hereafter, referred to as "pin side outer surface") 4d of the third extending portion 17, which is on the opposite side from the surface that faces the first extending portion 15. The pin upper surface 4c is flush with a surface (hereafter, referred to as "upper surface") 5a of the sealing resin layer 5 that is on the opposite side from the surface of the sealing resin layer 5 that faces the one main surface 2a and is exposed from the upper surface 5a. In addition, the pin side outer surface 4d is flush with a side surface 5b of the sealing resin layer 5 (refer to FIG. 1) and is exposed from the side surface 5b. That is, each metal pin is exposed from the sealing resin layer 5 along the entire length of the second extending portion 16 and along the entire length of the third extending portion 17.

The sealing resin layer 5 can be formed of a resin that is typically employed as a sealing resin such as an epoxy resin containing silica filler. Furthermore, alumina filler can be used in the sealing resin layer 5 in order to give the sealing resin layer 5 high thermal conductivity.

The shield layer 6 covers and contacts the surfaces of the sealing resin layer 5 (upper surface 5a and side surfaces 5b of sealing resin layer 5), the exposed surfaces of the metal pins 4 that are exposed from the sealing resin layer 5 (pin upper surface 4c and pin side outer surface 4d), and the sides surfaces of the wiring substrate 2. Regarding the shield layer 6 and the metal pins 4, a surface (hereafter, referred to as "upper inner wall surface") 6a of the shield layer 6 that faces the one main surface 2a and the pin upper surfaces 4c of the metal pins 4 contact each other, and an inner wall surface (hereafter referred to as "side inner wall surface") 6b of a side surface portion of the shield layer 6 and pin side outer surfaces 4d of the metal pins 4 contact each other. The shield layer 6 is connected to the ground electrodes 9b via the metal pins 4, the land electrodes 7b, and the via conductors 9c.

The shield layer 6 is for reducing the degree to which unwanted electromagnetic waves radiated from an external device reach the components 3 and so forth of the module 1 and for reducing the degree to which unwanted electromagnetic waves radiated from the components 3 and so forth of the module 1 leak to the outside.

The shield layer 6 can be formed so as to have a multilayer structure that for example includes: an adhesive layer that is stacked on the upper surface 5a and the side surfaces 5b of the sealing resin layer 5, the pin upper surfaces 4c and the pin side outer surfaces 4d of the metal pins 4, and the side surfaces of the wiring substrate 2; an electrically conductive layer that is stacked on the adhesive layer; and a corrosion resistant layer that is stacked on the electrically conductive layer. The adhesive layer is a layer that is provided in order to increase the strength of adhesion between the electrically conductive layer, the sealing resin layer 5, and so on, and can for example be formed of a metal such as stainless steel. The electrically conductive layer is a layer that realizes the substantial shielding function of the shield layer 6, and can be formed of any metal from among Cu, Ag, and Al, for example. The corrosion resistant layer is a layer that is provided in order to prevent corrosion of and damage to the electrically conductive layer, and can be formed of stainless steel, for example. For example, a sputtering method, a vapor deposition method, a paste coating method, and so on may be used when forming the shield layer 6.

Method of Manufacturing Module

Next, a method of manufacturing the module 1 will be described. In the first embodiment, the module 1 is manufactured by first forming an agglomeration of a plurality of modules 1 and then dividing the agglomeration into individual modules 1.

First, an agglomeration of wiring substrates 2 is prepared, in which for each wiring substrate 2, the plurality of land electrodes 7a and 7b are formed on the one main surface 2a, the plurality of outer electrodes 8 are formed on the other main surface 2b, and the plurality of wiring electrodes 9a, the plurality of ground electrodes 9b, the plurality of via conductors 9c, and so forth are formed in inner layers of the wiring substrate 2. The land electrodes 7a and 7b, the outer electrodes 8, the wiring electrodes 9a, and the ground electrodes 9b can be formed by performing screen printing using a conductive paste containing a metal such as Cu, Ag, Al, or the like. Furthermore, the via conductors 9c can be forming using a known method after forming via holes using a laser or the like.

Next, the components 3 are mounted on the one main surface 2a of the wiring substrate 2 using a known surface mount technology. For example, the solder 10 is formed on desired land electrodes 7a among the land electrodes 7a of the wiring substrate 2, the components 3 are mounted on the corresponding land electrodes 7a among the land electrodes 7a on which the solder 10 has been formed, and a reflow process is performed once the components 3 have been mounted. The agglomeration of wiring substrates 2 is washed as needed after the reflow process.

Next, the metal pins 4 are mounted on the one main surface 2a of the wiring substrate 2 such that the one end surfaces 4a thereof are attached to the land electrodes 7b using for example solder so as to form electrical connections and such that the other end surfaces 4b thereof contact the one main surface 2a. The metal pins 4 are formed of a metal such as copper using a die for example or are formed by bending rod-shaped pieces of a metal such as copper.

Next, a provisional sealing resin layer, which is the basis of the sealing resin layer 5, is formed on the one main surface 2a of the wiring substrate 2 so as to cover the one main surface 2a of the wiring substrate 2, the components 3 mounted on the one main surface 2a, and the metal pins 4 mounted on the one main surface 2a. For example, a transfer molding method, a compression molding method, a liquid resin method, a sheet resin method, and so forth may be used when forming the provisional sealing resin layer. Here, a general silica-filler-containing epoxy resin can be used for the provisional sealing resin layer. An epoxy resin containing alumina filler can also be used as the provisional sealing resin layer in order to give the provisional sealing resin layer high thermal conductivity. Plasma washing is performed on the wiring substrate 2 as needed before forming the provisional sealing resin layer.

Next, the sealing resin layer 5 is formed by subjecting the surface of the provisional sealing resin layer on the opposite side from the surface that faces the one main surface 2a to grinding until the pin upper surfaces 4c of the metal pins 4 are exposed.

Next, the individual modules 1 are obtained by performing cutting using a dicer or performing laser processing. The agglomeration is divided into individual modules 1 such that the pin side outer surfaces 4d of the metal pins 4 are exposed from the side surfaces 5b of the sealing resin layer 5. In the individual divided modules 1, the pin upper surfaces 4c of the metal pins 4 are exposed from the upper surface 5a of the sealing resin layer 5 and the pin side outer surfaces 4d of the metal pins 4 are exposed from the side surfaces 5b of the sealing resin layer 5.

Next, the shield layer 6 is formed so as cover the upper surface 5a and the side surfaces 5b of the sealing resin layer 5, the pin upper surfaces 4c and the pin side outer surfaces 4d of the metal pins 4, and the side surfaces of the wiring substrate 2. Regarding the shield layer 6 and the metal pins 4, the upper inner wall surface 6a of the shield layer 6 and the pin upper surfaces 4c of the metal pins 4 contact each other and the side inner wall surface 6b of the shield layer 6 and the pin side outer surfaces 4d of the metal pins 4 contact each other. For example, a sputtering method, a vapor deposition method, a paste coating method, and so on may be used when forming the shield layer 6.

According to the above-described first embodiment, since the upper inner wall surface 6a of the shield layer 6 and the pin upper surfaces 4c of the metal pins 4 contact each other and the side inner wall surface 6b of the shield layer 6 and the pin side outer surfaces 4d of the metal pins 4 contact each other, the areas of contact between the shield layer 6 and the metal pins 4 are large. Thus, the electrical connectivity between the shield layer 6 and the land electrodes 7b, which are formed at the one main surface 2a of the wiring substrate 2 and to which the metal pins 4 are attached, can be improved. As a result of the land electrodes 7b, to which the metal pins 4 are attached, being electrically connected to the ground electrodes 9b via the via conductors 9c, the shield layer 6 is satisfactorily electrically connected to the ground electrodes 9b and consequently the shielding effect realized by the shield layer 6 can be improved.

Furthermore, since it is not necessary for the ground electrodes 9b inside the wiring substrate 2 to extend to the end portions of the wiring substrate 2 in order to connect the ground electrodes 9b to the shield layer 6, the degree of freedom with respect to the design area of the wiring substrate 2 is also improved. In addition, the connection locations for realizing ground connection for the metal pins 4 can be freely changed by adjusting the lengths of the metal pins 4 and the degree of freedom with respect to the design area of the wiring substrate 2 is also improved.

In addition, in the case where the shield layer 6 and the ground electrodes 9b are electrically connected to each other, a process for exposing the ground electrodes 9b from the side surfaces of the wiring substrate 2 and directly connecting the shield layer 6 and the ground electrodes 9b to each other is unnecessary and therefore the process of electrically connecting the shield layer 6 to the ground electrodes 9b is simplified.

An example has been described in which the other end surfaces 4b of the metal pins 4 simply contact the wiring substrate 2, but the other end surfaces 4b of the metal pins 4 may be instead be fixed to surface electrodes of the wiring substrate 2 (the surface electrodes to not have to be connected to the ground electrodes 9b of the wiring substrate 2 and simply have the role of fixing the metal pins 4) using for example solder.

Modification 1

Figure 3:
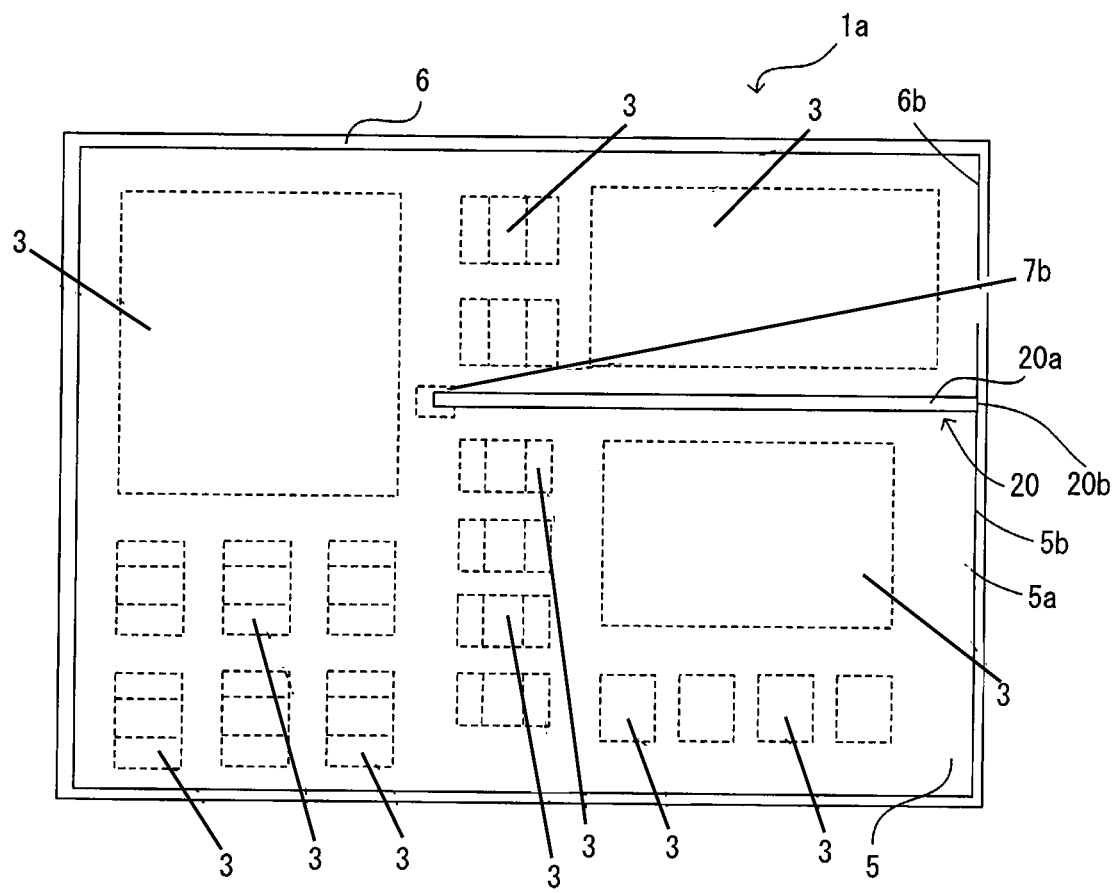
FIG. 3 is a plan view of a module according to modification 1 of the first embodiment of the present disclosure in a state where an upper surface part of the shield layer of the module has been removed.

Modification 1 of the module 1 according to the first embodiment of the present disclosure will be described while referring to FIG. 3. FIG. 3 is a plan view of a module 1a according to modification 1 of the first embodiment in a state where an upper surface part of the shield layer 6 of the module 1a has been removed.

The module 1a according to modification 1 of the first embodiment differs from the module 1 according to the first embodiment described using FIGS. 1 and 2 in that, as illustrated in FIG. 3, one end surface of a metal pin 20 is electrically connected to a land electrode 7b that is near the center of the one main surface 2a and separated from the sides of the one main surface 2a. The rest of the configuration is the same as that of the module 1 according to the first embodiment, and therefore the same reference symbols are used and description thereof is omitted.

The metal pin 20 has a shape obtained by lengthening the second extending portion 16 of the metal pin 4 of the first embodiment. One end surface of the metal pin 20 is attached to the land electrode 7b that is disposed near the center and away from the sides of the one main surface 2a so as to form an electrical connection, and the other end surface of the metal pin 20 contacts the one main surface 2a. Similarly to the metal pin 4 of the first embodiment, the metal pin 20 has a pin upper surface 20a that is flush with the upper surface 5a of the sealing resin layer 5 and is exposed from the upper surface 5a and a pin side outer surface 20b that is flush with the side surface 5b of the sealing resin layer 5 and is exposed from the side surface 5b. The pin upper surface 20a contacts the surface, which is not illustrated in FIG. 3, of the shield layer 6 that faces the one main surface 2a and the pin side outer surface 20b contacts an inner wall surface (side inner wall surface 6b) of a side surface portion of the shield layer 6.

As illustrated in the first embodiment and modification 1 of the first embodiment described above, the shield layer 6 can be electrically connected to the ground electrode 9b using an arbitrary electrode formed at the one main surface 2a of the wiring substrate 2 by using a metal pin (metal pin 4, metal pin 20).

Modification 2

Figure 4:
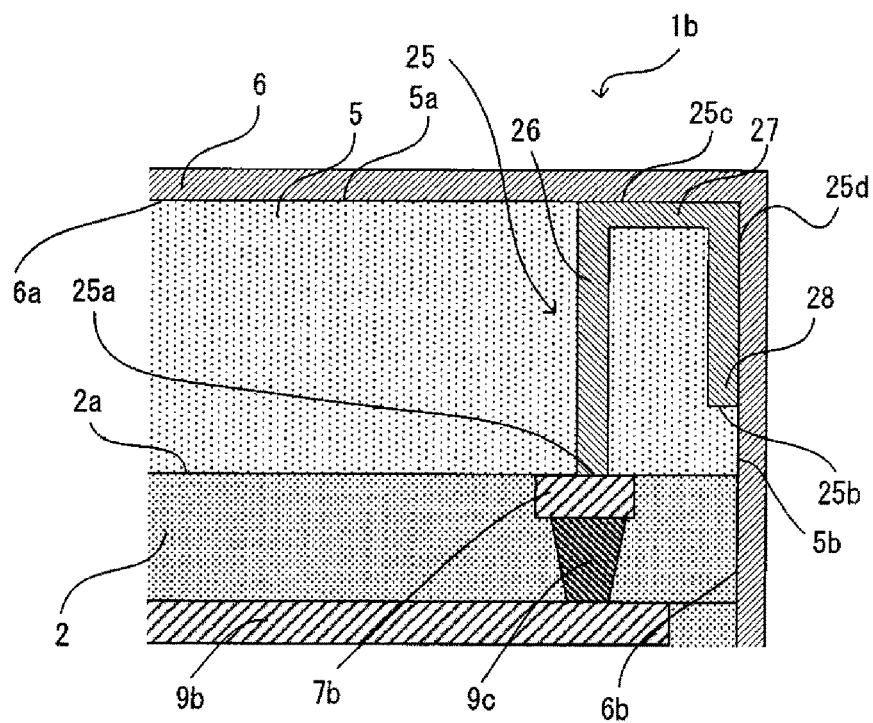
FIG. 4 is a diagram illustrating part of a cross section of a module according to modification 2 of the first embodiment of the present disclosure.

Modification 2 of the module 1 according to the first embodiment of the present disclosure will be described while referring to FIG. 4. FIG. 4 is a diagram illustrating part of a cross section of a module 1b according to modification 2 of the first embodiment.

The module 1b according to modification 2 of the first embodiment differs from the module 1 according to the first embodiment described using FIGS. 1 and 2 in that, as illustrated in FIG. 4, a metal pin 25 is used that is shaped such that a third extending portion 28 thereof is shorter than a first extending portion 26 thereof and another end surface 25b of the metal pin 25 does not contact the one main surface 2a of the wiring substrate 2. The rest of the configuration is the same as that of the module 1 according to the first embodiment, and therefore the same reference symbols are used and description thereof is omitted.

One end surface 25a of the metal pin 25 is attached to a land electrode 7b using for example solder so as to form an electrical connection and the other end surface 25b of the metal pin 25 does not contact the one main surface 2a. The metal pin 25 has the first extending portion 26, which has a rectangular parallelepiped shape, that extends from the one end surface 25a away from the one main surface 2a. In addition, the metal pin 25 has a rectangular-parallelepiped-shaped second extending portion 27 that is bent at a prescribed angle such as a right angle and extends from one end of the first extending portion 26 on the opposite side from the one end surface 25a. Furthermore, the metal pin 25 has a rectangular-parallelepiped-shaped third extending portion 28 that is shorter than the first extending portion 26 and is bent and extends from one end of the second extending portion 27 on the opposite side from the first extending portion 26 so as to approach the one main surface 2a up to a position without necessarily reaching the one main surface 2a.

A surface (pin upper surface) 25c of the second extending portion 27 that is on the opposite side from the surface of the second extending portion 27 that faces the one main surface 2a is flush with the upper surface 5a of the sealing resin layer 5 and is exposed from the upper surface 5a. Furthermore, a surface (pin side outer surface) 25d of the third extending portion 28 on the opposite side from the surface of the third extending portion 28 that faces the first extending portion 26 is flush with the side surface 5b of the sealing resin layer 5 and is exposed from the side surface 5b. Regarding the shield layer 6 and the metal pin 25, the upper inner wall surface 6a of the shield layer 6 and the pin upper surface 25c of the metal pin 25 contact each other and the side inner wall surface 6b of the shield layer 6 and the pin side outer surface 25d of the metal pin 25 contact each other. The shield layer 6 is connected to the ground electrode 9b via the metal pin 25, the land electrode 7b, and the via conductor 9c.

According to modification 2 of the first embodiment described above, the metal pin 25 is buried inside the sealing resin layer 5 except that the one end surface 25a is exposed from the sealing resin layer 5, and therefore a gap is not generated between the metal pin 25 and the one main surface 2a of the wiring substrate 2 due to the metal pin 25 being exposed from the sealing resin layer 5 and the performance reliability of the module 1b is improved. In particular, if a gap is generated between the wiring substrate 2 and the sealing resin layer 5, the gap may lead to a reduction in reliability. Furthermore, it is possible to prevent problems such as short circuits in the wiring substrate 2, degradation of the characteristics of the wiring substrate 2, or occurrence of electrochemical migration in solder of mounted components such as the components 3 due to moisture or the like entering the wiring substrate 2.

Second Embodiment

Figure 5:
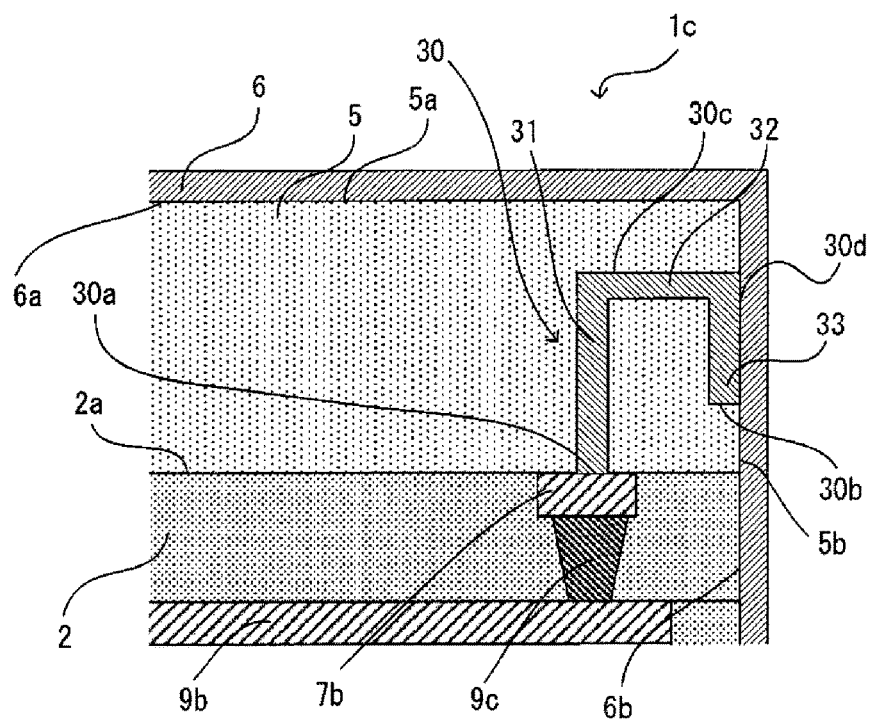
FIG. 5 is a diagram illustrating part of a cross section of a module according to a second embodiment of the present disclosure.

A module 1c according to a second embodiment of the present disclosure will be described while referring to FIG. 5. FIG. 5 is a diagram illustrating part of the module 1c according to the second embodiment.

The module 1c according to the second embodiment differs from the module 1b according to modification 2 of the first embodiment described using FIG. 4 in that, as illustrated in FIG. 5, a metal pin 30 does not contact the upper inner wall surface 6a of the shield layer 6 and only contacts the side inner wall surface 6b of the shield layer 6. The rest of the configuration is the same as of the module 1b according to modification 2 of the first embodiment, and therefore the same reference symbols are used and description thereof is omitted.

One end surface 30a of the metal pin 30 is attached to a land electrode 7b using for example solder so as to form an electrical connection and another end surface 30b of the metal pin 30 does not contact the one main surface 2a. The metal pin 30 has a rectangular-parallelepiped-shaped first extending portion 31 that extends from the one end surface 30a away from the one main surface 2a. In addition, the metal pin 30 has a rectangular-parallelepiped-shaped second extending portion 32 that is bent at a prescribed angle such as a right angle and extends from one end of the first extending portion 31 on the opposite side from the one end surface 30a. Furthermore, the metal pin 30 has a rectangular-parallelepiped-shaped third extending portion 33 that is shorter than the first extending portion 31 and is bent and extends from one end of the second extending portion 32 on the opposite side from the first extending portion 31 so as to approach the one main surface 2a up to a position without necessarily reaching the one main surface 2a.

A surface (pin upper surface) 30c of the second extending portion 32 on the opposite side from the surface of the second extending portion 32 that faces the one main surface 2a is buried inside the sealing resin layer 5 and is not exposed from the upper surface 5a of the sealing resin layer 5. Furthermore, a surface (pin side outer surface) 30d of the third extending portion 33 on the opposite side from the surface of the third extending portion 33 that faces the first extending portion 31 is flush with the side surface 5b of the sealing resin layer 5 and is exposed from the side surface 5b. Regarding the shield layer 6 and the metal pin 30, the side inner wall surface 6b of the shield layer 6 and the pin side outer surface 30d of the metal pin 30 contact each other. The upper inner wall surface 6a of the shield layer 6 and the pin upper surface 30c of the metal pin 30 do not contact each other. The shield layer 6 is connected to the ground electrode 9b via the metal pin 30, the land electrode 7b, and the via conductor 9c.

According to the second embodiment described above, since the side inner wall surface 6b of the shield layer 6 and the pin side outer surface 30d of the metal pin 30 contact each other, the area of contact between the shield layer 6 and the metal pin 30 is large. Thus, the electrical connectivity between the shield layer 6 and the land electrode 7b, which is formed at the one main surface 2a of the wiring substrate 2 and to which the metal pin 30 is attached, can be improved. As a result of the land electrode 7b, to which the metal pin 30 is attached, being electrically connected to the ground electrode 9b via the via conductor 9c, the shield layer 6 is satisfactorily electrically connected to the ground electrode 9b and consequently the shielding effect realized by the shield layer 6 can be improved.

In addition, in the case where the shield layer 6 and the ground electrode 9b are electrically connected to each other, a process for exposing the ground electrode 9b from the side surface of the wiring substrate 2 and directly connecting the shield layer 6 and the ground electrode 9b to each other is unnecessary and therefore the process of electrically connecting the shield layer 6 to the ground electrodes 9b is simplified.

Modification 1

Figure 6:
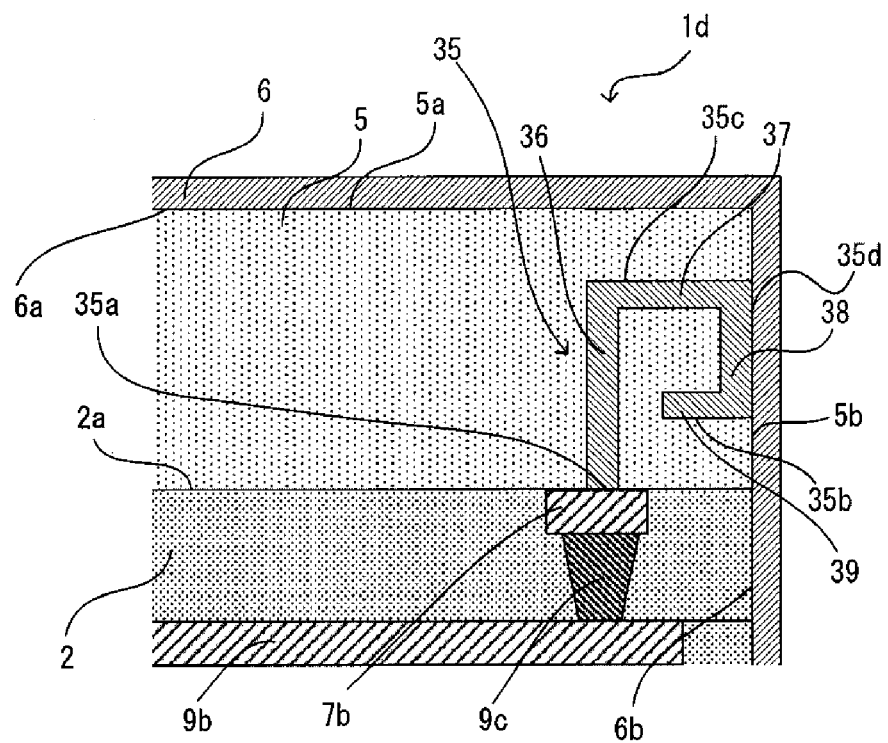
FIG. 6 is a diagram illustrating part of a cross section of a module according to modification 1 of the second embodiment of the present disclosure.

Modification 1 of the module 1c according to the second embodiment of the present disclosure will be described while referring to FIG. 6. FIG. 6 is a diagram illustrating part of a cross section of a module 1d according to modification 1 of the second embodiment.

The module 1d according to modification 1 of the second embodiment differs from the module 1c according to the second embodiment described using FIG. 5, in that, as illustrated in FIG. 6, a metal pin 35 is used that has a shape having a fourth extending portion 39 that is bent and extends from one end of a third extending portion 38 so as to approach a first extending portion 36. The rest of the configuration is the same as that of the module 1c according to the second embodiment, and therefore the same reference symbols are used and description thereof is omitted.

One end surface 35a of the metal pin 35 is attached to the land electrode 7b using for example solder so as to form an electrical connection. The metal pin 35 has the first extending portion 36, which has a rectangular parallelepiped shape, that extends from one end surface 35a thereof away from the one main surface 2a. In addition, the metal pin 35 has a rectangular-parallelepiped-shaped second extending portion 37 that is bent at a prescribed angle such as a right angle and extends from one end of the first extending portion 36 on the opposite side from the one end surface 35a of the first extending portion 36. Furthermore, the metal pin 35 has the rectangular-parallelepiped-shaped third extending portion 38 that is bent and extends from one end of the second extending portion 37 on the opposite side from the first extending portion 36 so as to approach the one main surface 2a up to a position without necessarily reaching the one main surface 2a. Furthermore, the metal pin 35 has the rectangular parallelepiped shaped fourth extending portion 39 that is bent and extends from one end of the third extending portion 38 on the opposite side from the second extending portion 37 so as to approach the first extending portion 36 up to a position without necessarily reaching the first extending portion 36. A surface 35b of the fourth extending portion 39 that faces the one main surface 2a does not contact the one main surface 2a.

A surface (pin upper surface) 35c of the second extending portion 37 on the opposite side from the surface of the second extending portion 37 that faces the one main surface 2a is buried inside the sealing resin layer 5 and is not exposed from the upper surface 5a of the sealing resin layer 5. Furthermore, a surface (pin side outer surface) 35d of the third extending portion 38 on the opposite side from the surface of the third extending portion 38 that faces the first extending portion 36 is flush with the side surface 5b of the sealing resin layer 5 and is exposed from the side surface 5b. Regarding the shield layer 6 and the metal pin 35, the side inner wall surface 6b of the shield layer 6 and the pin side outer surface 35d of the metal pin 35 contact each other. The upper inner wall surface 6a of the shield layer 6 and the pin upper surface 35c of the metal pin 35 do not contact each other. The shield layer 6 is connected to the ground electrode 9b via the metal pin 35, the land electrode 7b, and the via conductor 9c.

Third Embodiment

Figure 7:
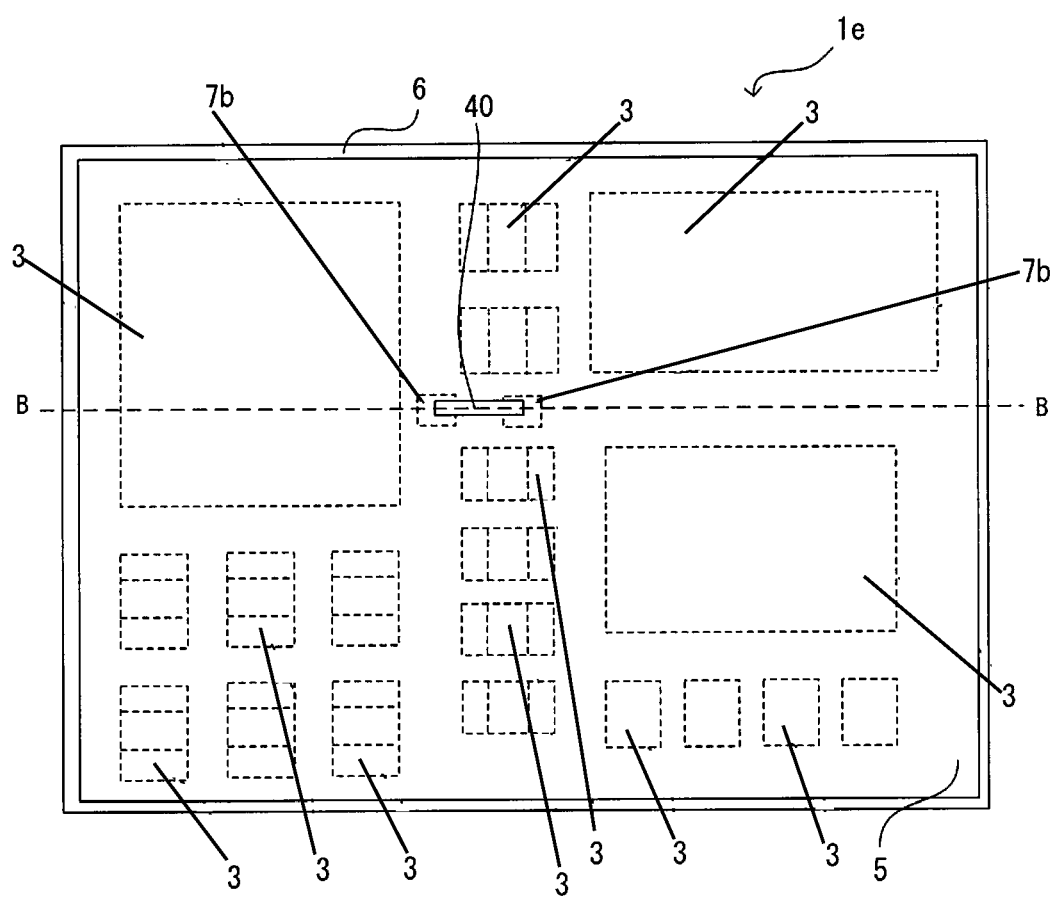
FIG. 7 is a plan view of a module according to a third embodiment of the present disclosure in a state where an upper surface part of a shield layer of the module has been removed.
Figure 8A:
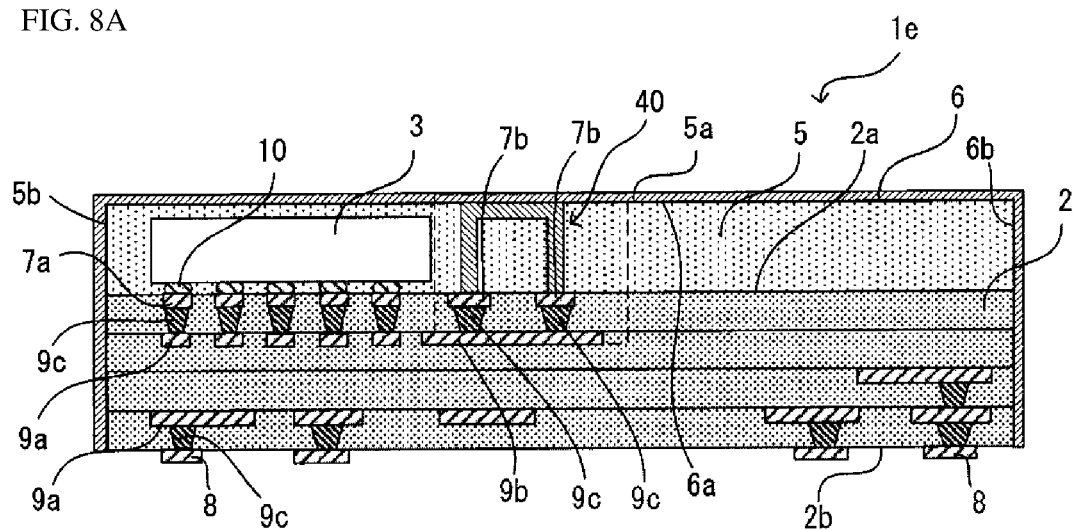
FIG. 8A is a sectional view taken along B-B in FIG. 7 so as to include the upper surface part of the shield layer and FIG. 8B is an enlarged view of a part enclosed by a broken line in FIG. 8A.
Figure 8B:
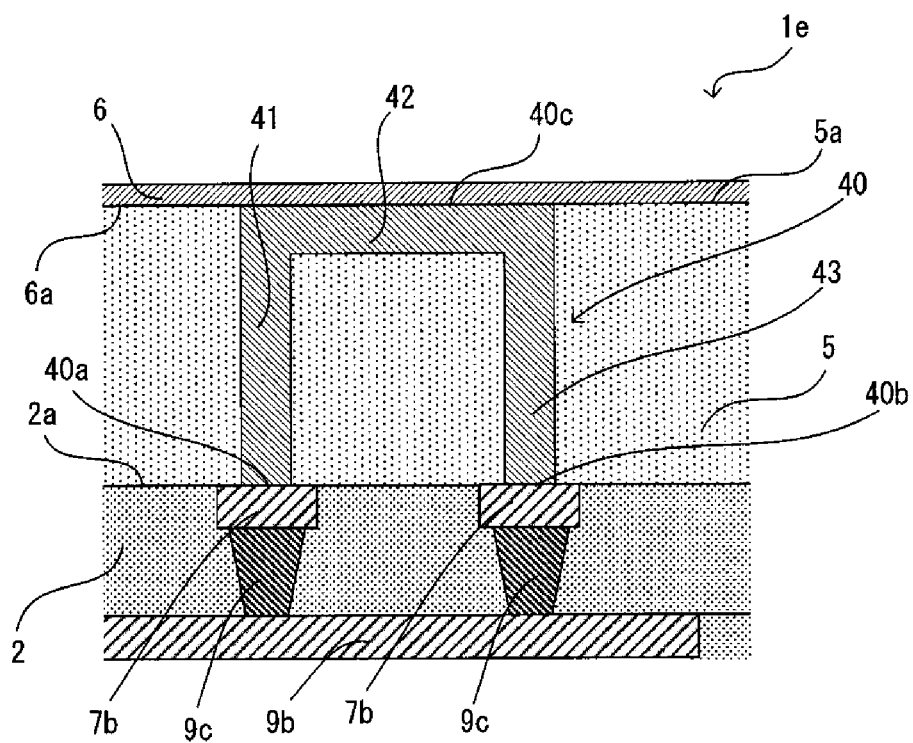

A module 1e according to a third embodiment of the present disclosure will be described while referring to FIGS. 7 and 8. FIG. 7 is a plan view of the module 1e according to the third embodiment in a state where an upper surface part of a shield layer 6 of the module 1e has been removed. FIG. 8A is a sectional view taken along B-B in FIG. 7 so as to include the upper surface part of the shield layer 6 and FIG. 8B is an enlarged view of a part enclosed by a broken line in FIG. 8A.

The module 1e according to the third embodiment differs from the module 1 according to the first embodiment described using FIGS. 1 and 2 in that, as illustrated in FIGS. 7 and 8, a metal pin 40 does not contact the side inner wall surface 6b of the shield layer 6 and contacts only the upper inner wall surface 6a of the shield layer 6 and in that both end surfaces 40a and 40b of the metal pin 40 are connected to the land electrodes 7b. The rest of the configuration is the same as that of the module 1 according to the first embodiment, and therefore the same reference symbols are used and description thereof is omitted.

The metal pin 40 is provided around the center of the wiring substrate 2. The metal pin 40 has an inverted U shape, one end surface 40a thereof is attached to a land electrode 7b using for example solder so as to form an electrical connection and the other end surface 40b thereof is attached to another land electrode 7b using for example solder so as to form an electrical connection. The metal pin 40 has a first extending portion 41, which has a rectangular parallelepiped shape, that extends from the one end surface 40a away from the one main surface 2a. In addition, the metal pin 40 has a rectangular-parallelepiped-shaped second extending portion 42 that is bent at a prescribed angle such as a right angle and extends from one end of the first extending portion 41 on the opposite side from the one end surface 40a. Furthermore, the metal pin 40 has a rectangular-parallelepiped-shaped third extending portion 43 that has the same length as the first extending portion 41 and is bent and extends from one end of the second extending portion 42 on the opposite side from the first extending portion 41 so as to approach the one main surface 2a to a position at which the third extending portion 43 contacts the land electrode 7b formed on the one main surface 2a.

The one end surface 40a and the other end surface 40b of the metal pin 40 are exposed from the surface of the sealing resin layer 5 that faces the one main surface 2a, a surface (pin upper surface) 40c of the second extending portion 42 on the opposite side from the surface of the second extending portion 42 that faces the one main surface 2a is flush with the upper surface 5a of the sealing resin layer 5 and is exposed from the upper surface 5a and the rest of the metal pin 40 is buried inside the sealing resin layer 5 so as not to be exposed from the sealing resin layer 5. Regarding the shield layer 6 and the metal pin 40, the upper inner wall surface 6a of the shield layer 6 and the pin upper surface 40c of the metal pin 40 contact each other. The metal pin 40 does not contact the side inner wall surface 6b of the shield layer 6. The shield layer 6 is connected to the ground electrode 9b via the metal pin 40, the land electrodes 7b, and the via conductors 9c.

According to the third embodiment described above, since the upper inner wall surface 6a of the shield layer 6 and the pin upper surface 40c of the metal pin 40 contact each other, the area of contact between the shield layer 6 and the metal pin 40 is large. Thus, the electrical connectivity between the shield layer 6 and the land electrodes 7b, which are formed at the one main surface 2a of the wiring substrate 2 and to which the metal pin 40 is attached, can be improved. As a result of the land electrodes 7b, to which the metal pin 40 is attached, being electrically connected to the ground electrode 9b via the via conductors 9c, the shield layer 6 is satisfactorily electrically connected to the ground electrode 9b and consequently the shielding effect realized by the shield layer 6 can be improved.

In addition, in the case where the shield layer 6 and the ground electrode 9b are electrically connected to each other, a process for exposing the ground electrode 9b from the side surfaces of the wiring substrate 2 and directly connecting the shield layer 6 and the ground electrode 9b to each other is unnecessary and therefore the process of electrically connecting the shield layer 6 to the ground electrode 9b is simplified.

Modification 1

Figure 9:
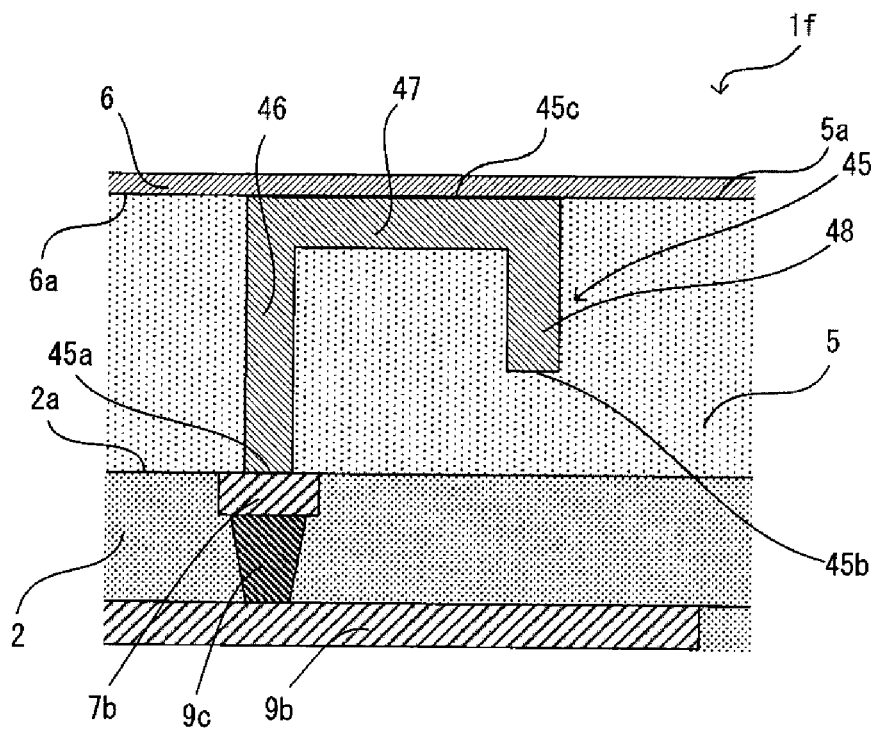
FIG. 9 is a diagram illustrating part of a cross section of a module according to modification 1 of the third embodiment of the present disclosure.
Figure 10:
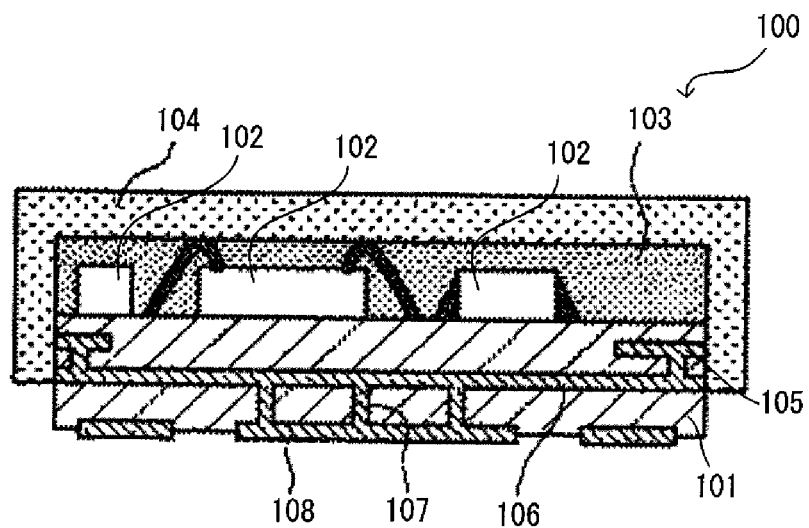
FIG. 10 is a sectional view of a module of the related art.

Modification 1 of the module 1e according to the third embodiment of the present disclosure will be described while referring to FIG. 9. FIG. 9 is a diagram illustrating part of a cross section of a module 1f according to modification 1 of the third embodiment.

The module 1f according to modification 1 of the third embodiment differs from the module 1e according to the third embodiment described using FIG. 5 in that, as illustrated in FIG. 9, a metal pin 45 is used that is shaped such that a third extending portion 48 thereof is shorter than a first extending portion 46 thereof and another end surface 45b of the metal pin 45 does not contact a land electrode 7b formed on the one main surface 2a of the wiring substrate 2. The rest of the configuration is the same as that of the module 1e according to the third embodiment, and therefore the same reference symbols are used and description thereof is omitted.

One end surface 45a of the metal pin 45 is attached to a land electrode 7b using for example solder so as to form an electrical connection and the other end surface 45b of the metal pin 45 does not contact a land electrode 7b formed on the one main surface 2a and does not contact the one main surface 2a. The metal pin 45 has the rectangular-parallelepiped-shaped first extending portion 46 that extends from the one end surface 45a away from the one main surface 2a. In addition, the metal pin 45 has a rectangular-parallelepiped-shaped second extending portion 47 that is bent at a prescribed angle such as a right angle and extends from one end of the first extending portion 46 on the opposite side from the one end surface 45a. Furthermore, the metal pin 45 has a rectangular-parallelepiped-shaped third extending portion 48 that is shorter than the first extending portion 46 and is bent and extends from one end of the second extending portion 47 on the opposite side from the first extending portion 46 so as to approach the one main surface 2a up to a position without necessarily reaching the one main surface 2a.

The one end surface 45a of the metal pin 45 is exposed from the surface of the sealing resin layer 5 that faces the one main surface 2a, a surface (pin upper surface) 45c of the second extending portion 47 on the opposite side from the surface of the second extending portion 47 that faces the one main surface 2a is flush with the upper surface 5a of the sealing resin layer 5 and is exposed from the upper surface 5a and the rest of the metal pin 45 is buried inside the sealing resin layer 5 so as not to be exposed from the sealing resin layer 5. Regarding the shield layer 6 and the metal pin 45, the upper inner wall surface 6a of the shield layer 6 and the pin upper surface 45c of the metal pin 45 contact each other. The metal pin 45 does not contact the side inner wall surface 6b of the shield layer 6. The shield layer 6 is connected to the ground electrode 9b via the metal pin 45, the land electrode 7b, and the via conductor 9c.

The present disclosure is not limited to the above-described embodiments and can be modified in various ways not described above so long as they do not depart from the gist of the disclosure. For example, the extending portions are described as having a rectangular parallelepiped shape, but may instead have a columnar shape other than a rectangular parallelepiped shape such as a hexagonal columnar shape. Alternatively, the extending portions may have a cylindrical shape. In addition, the content of the embodiments and the content of the modifications described above may be combined with each other.

INDUSTRIAL APPLICABILITY

The present disclosure can be applied to modules that have a shield layer.

REFERENCE SIGNS LIST 1 to 1f module
2 wiring substrate
2a one main surface
3 component
4, 20, 25, 30, 35, 40, 45 metal pin
15, 26, 31, 36, 41, 46 first extending portion
16, 27, 32, 37, 42, 47 second extending portion
17, 28, 33, 38, 43, 48 third extending portion
39 fourth extending portion
5 sealing resin layer
6 shield layer

The invention claimed is:
1. A module comprising:
a wiring substrate;
a component that is mounted on one main surface of the wiring substrate;
a metal pin that has one end surface that is attached to an electrode provided at the one main surface and that includes a first extending portion that extends from the one end surface away from the one main surface, a second extending portion that is bent and extends from one end of the first extending portion on an opposite side from the one end surface, and a third extending portion that is bent and extends from one end of the second extending portion on an opposite side from the first extending portion so as to approach the one main surface;
a sealing resin layer that covers the one main surface, the component, and the metal pin except for at least a part of the extending portions; and
a shield layer that covers a side surface of the wiring substrate and a surface of the sealing resin layer;
wherein the third extending portion extends lengthwise along a side surface of the shield layer such that the third extending portion contacts the shield layer along an entire length of the third extending portion.

2. The module according to claim 1, wherein the second extending portion of the metal pin contacts the shield layer.

3. The module according to claim 2, wherein the third extending portion of the metal pin contacts a side surface of the shield layer.

4. The module according to claim 2, wherein the third extending portion extends up to a position at which the third extending portion contacts the wiring substrate.

5. The module according to claim 2, wherein the third extending portion does not extend up to a position at which the third extending portion would contact the wiring substrate.

6. The module according to claim 2, wherein the first extending portion is connected to a ground electrode provided in or on the wiring substrate via the electrode.

7. The module according to claim 1, wherein the third extending portion extends up to a position at which the third extending portion contacts the wiring substrate.

8. The module according to claim 7, wherein the first extending portion is connected to a ground electrode provided in or on the wiring substrate via the electrode.

9. The module according to claim 1, wherein the third extending portion does not extend up to a position at which the third extending portion would contact the wiring substrate.

10. The module according to claim 9, wherein the first extending portion is connected to a ground electrode provided in or on the wiring substrate via the electrode.

11. The module according to claim 1, wherein the first extending portion is connected to a ground electrode provided in or on the wiring substrate via the electrode.

12. The module according to claim 1, wherein the second extending portion is bent at a right angle from the first extending portion.

13. The module according to claim 1, wherein the metal pin further includes a fourth extending portion that is bent and extends from one end of the third extending portion on an opposite side from the second extending portion.

14. The module according to claim 1, wherein the third extending portion of the metal pin extends substantially parallel to the first extending portion.

* * * * *